(12) United States Patent
Aoki

(10) Patent No.: US 7,768,328 B2
(45) Date of Patent: Aug. 3, 2010

(54) SEMICONDUCTOR CIRCUIT

(75) Inventor: Yasushi Aoki, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 12/232,144

(22) Filed: Sep. 11, 2008

(65) Prior Publication Data

US 2009/0091364 A1   Apr. 9, 2009

(30) Foreign Application Priority Data

Oct. 3, 2007   (JP)   ............................ 2007-259664

(51) Int. Cl.
 *H03K 3/017*   (2006.01)
(52) U.S. Cl. ...................................... 327/175; 330/259
(58) Field of Classification Search ........................ None
 See application file for complete search history.

(56) References Cited

U.S. PATENT DOCUMENTS

| | | | |
|---|---|---|---|
| 5,013,937 A | | 5/1991 | Aoki |
| 5,471,665 A | * | 11/1995 | Pace et al. ................ 455/343.2 |
| 5,594,387 A | | 1/1997 | Kagawa |
| 5,990,716 A | * | 11/1999 | Chen ........................... 327/172 |
| 6,812,777 B2 | | 11/2004 | Tamura et al. |
| 6,867,650 B2 | | 3/2005 | Kimura |
| 6,873,209 B2 | | 3/2005 | Takata et al. |
| 7,132,882 B2 | * | 11/2006 | Chen et al. ..................... 330/9 |
| 7,193,430 B2 | | 3/2007 | Ookawa |
| 7,230,989 B2 | * | 6/2007 | Biman et al. ................. 375/259 |
| 7,408,993 B2 | * | 8/2008 | Webster ....................... 375/257 |
| 7,532,065 B2 | * | 5/2009 | Chen et al. ...................... 330/9 |
| 2004/0227572 A1 | | 11/2004 | Takata et al. |
| 2007/0046333 A1 | | 3/2007 | Eimitsu et al. |
| 2007/0159224 A1 | | 7/2007 | Dwarka et al. |

FOREIGN PATENT DOCUMENTS

| | | |
|---|---|---|
| JP | 01-286618 | 11/1989 |
| JP | 06-260920 | 9/1994 |
| JP | 07-016158 | 2/1995 |
| JP | 11-274902 | 10/1999 |
| JP | 2003-179447 A | 6/2003 |
| JP | 2003-347920 A | 12/2003 |
| JP | 2004-343277 A | 12/2004 |
| JP | 2005-026760 A | 1/2005 |
| JP | 2005-130185 A | 5/2005 |
| JP | 2005-184221 A | 7/2005 |
| JP | 2007-060069 A | 3/2007 |

* cited by examiner

*Primary Examiner*—Cassandra Cox
(74) *Attorney, Agent, or Firm*—Foley & Lardner LLP

(57) ABSTRACT

A semiconductor circuit according to the present invention includes: a differential input section to receive input differential signals; a load resistance section to output a voltage according to a current output by the differential input section; differential signal output terminals to output a differential signal corresponding to the voltage output from the load resistance section; a low-pass filter to extract a direct-current component of the differential signal output from the differential signal output terminals; and a load adjustment section to feed back the direct-current component extracted by the low-pass filter to adjust a resistance value of the load resistance section.

30 Claims, 23 Drawing Sheets

SEMICONDUCTOR CIRCUIT

BACKGROUND OF THE INVENTION

1. Field of the Invention

The present invention relates to a semiconductor circuit and, more particularly, to a semiconductor circuit to correct degradation in duty cycle of a differential signal to be output.

2. Description of Related Art

In recent years, current mode logic (CML) has been attracting much attention as a high-speed signal transmission system. In the CML, a differential signal transmission system is employed to transmit signals. Moreover, in the CML, a signal level having a small amplitude (hereinafter, referred to as "CML level") is used, and in an internal circuit to which signals are transmitted, a signal level having a large amplitude (hereinafter, referred to as "CMOS level") in a range from a power supply voltage to a ground voltage is used.

FIG. 18 shows a schematic diagram of a circuit 1800 receiving differential clock signals that are small signals such as the CML level, to convert the differential clock signals into differential clock signals having a large amplitude such as the CMOS level to be distributed. As shown in FIG. 18, multiple stages of differential amplifiers 1801 and 1802 first amplify differential clock signals IT and IB that are small signals of the CML level, and then output differential clock signals OT and OB that are converted into signals of the CMOS level. Hereinafter, the differential clock signals IT and IB are abbreviated as IT/IB and the differential clock signals OT and OB are also abbreviated as OT/OB. The same is applied to other differential signals.

As the differential amplifiers 1801 and 1802 shown in FIG. 18, there is used a circuit disclosed in Japanese Patent No. 7-16158. Examples of the circuit include a differential amplifier 1900 as shown in FIG. 19. The differential amplifier 1900 includes NMOS transistors N1901a and N1901b, NMOS transistors N1902a and N1902b, and PMOS transistors P1903a and P1903b. In the differential amplifier 1900 as shown in FIG. 19, when the differential signals IT/IB to be input have different offsets, there arises a problem in that offset components are also amplified, with the result that the degradation in duty cycle is increased.

As shown in FIG. 20, as a countermeasure against the degradation in duty cycle, there is provided a differential amplifier 2000 disclosed in Japanese Unexamined Patent Application Publication No. 2007-60069. The differential amplifier 2000 is constituted by adding PMOS transistors P2001a and P2001b, NMOS transistors N2002a and N2002b, and a transfer gate 2003 to the differential amplifier 1900.

The solid line of FIG. 21 represents a frequency characteristic of the differential amplifier 2000, and the dashed line of FIG. 21 represents a frequency characteristic of the differential amplifier 1900. As apparent from the frequency characteristics shown in FIG. 21, the differential amplifier 2000 suppresses the amplitude of a low-frequency component and amplifies the amplitude of a predetermined high-frequency component. Consideration is given to a case where the input differential signals IT/IB are input to the differential amplifier 2000 as shown in FIG. 22.

The input differential signals IT/IB shown in FIG. 22 have an amplitude Y1 and a difference in offset voltage of X1. In this case, even when the amplitude of both the input differential signals IT/IB is Y1, the duty cycle of the differential signals is, for example, 60:40, whereby symmetry is lowered. In this case, when the input differential signals IT/IB are input to the differential amplifier 2000, the differential amplifier 2000 suppresses the amplitude of the low-frequency component and amplifies the amplitude of the predetermined high-frequency component, thereby suppressing an offset voltage component of each of the input differential signals IT/IB and amplifying the amplitude of a signal component having the amplitude Y1. As a result, as shown in FIG. 23, the differential amplifier 2000 outputs output differential signals OT/OB having an amplitude of Y2 and a difference in offset voltage of X2. The degradation in duty cycle of the output differential signals OT/OB is improved, and the duty cycle is about 50:50.

However, the correction of the degradation in duty cycle by the differential amplifier 2000 is effective only for the input differential signals IT/IB input to input terminals IT and IB of the differential amplifier 2000. In other words, it is impossible to prevent the degradation in duty cycle of the output differential clock signals due to relative process variations among transistors constituting the differential amplifier 2000 itself, imbalance in parasitic capacitance and parasitic resistance of wires of the differential amplifier 2000, and the like. Further, it is impossible to obtain the effect of correcting the degradation in duty cycle of the differential signals caused by relative variations among transistors constituting the differential amplifier 2000 and subsequent circuits.

Further, Japanese Unexamined Patent Application Publication No. 11-274902 discloses a technique in which a low-pass filter is connected to a differential output of a differential receiver and a difference in output of the low-pass filter is amplified to be fed back to an input of the differential receiver, thereby correcting the duty cycle. In the technique, however, if elements such as transistors constituting a correction differential amplifier vary, there arises a problem in that an input offset cannot be compensated and the duty cycle of a differential signal to be output is degraded.

SUMMARY

In one embodiment of the present invention, there is provided a semiconductor circuit including: a differential input section to receive input differential signals; a load resistance section to output a voltage according to a current output by the differential input section; differential signal output terminals to output a differential signal corresponding to the voltage output from the load resistance section; a low-pass filter to extract a direct-current component of the differential signal output from the differential signal output terminals; and a load adjustment section to feed back the direct-current component extracted by the low-pass filter to adjust a resistance value of the load resistance section.

The semiconductor circuit according to the present invention feeds back a DC voltage component of an offset from the differential signal output terminals, which is extracted from the low-pass filter, to the differential input section receiving the input differential signal. A feedback loop is constituted so that the DC voltage component fed back as described above is used by the load adjustment section to adjust the resistance value of the load resistance section. Accordingly, the circuit constituting the feedback loop corrects the degradation in duty cycle of the differential signals output from the differential signal output terminals.

According to the present invention, it is possible to correct not only the degradation in duty cycle of input differential signals, but also the degradation in duty cycle due to variations among transistors constituting the circuit itself, which cannot be corrected by the conventional differential amplifier, with a simple circuit configuration.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Hereinafter, a specific first embodiment of a semiconductor circuit to which the present invention is applied will be described in detail with reference to the drawings. In the first embodiment, the present invention is applied to a semiconductor circuit 100 to amplify small-amplitude differential clock signals and convert the amplified differential clock signals into large-amplitude differential clock signals.

Figure 1:
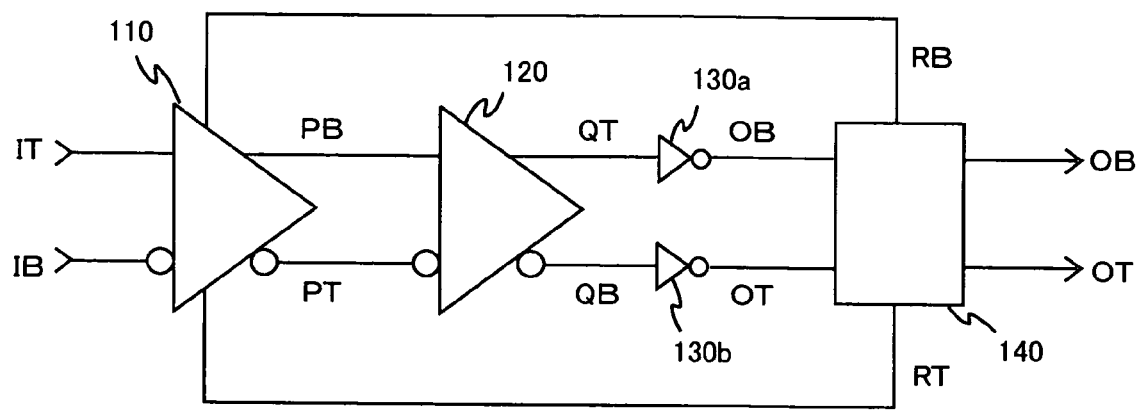
FIG. 1 shows a schematic configuration of a semiconductor circuit according to a first embodiment of the present invention.

FIG. 1 shows an example of a schematic configuration of the semiconductor circuit 100 according to the first embodiment. The semiconductor circuit 100 includes differential amplifiers 110 and 120, CMOS inverters 130a and 130b, and a low-pass filter 140. The differential amplifier 110 receives input differential signals IT/IB and outputs amplified differential signals PB/PT. The differential amplifier 120 receives the differential signals PB/PT and outputs amplified differential signals QT/QB. The CMOS inverters 130a and 130b invert the differential signals QT/QB, respectively, and output differential signals OB/OT, respectively. The low-pass filter 140 receives the differential signals OB/OT and outputs voltage signals RB/RT, which are direct-current components of the differential signals OB/OT, to the differential amplifier 110.

Figure 2:
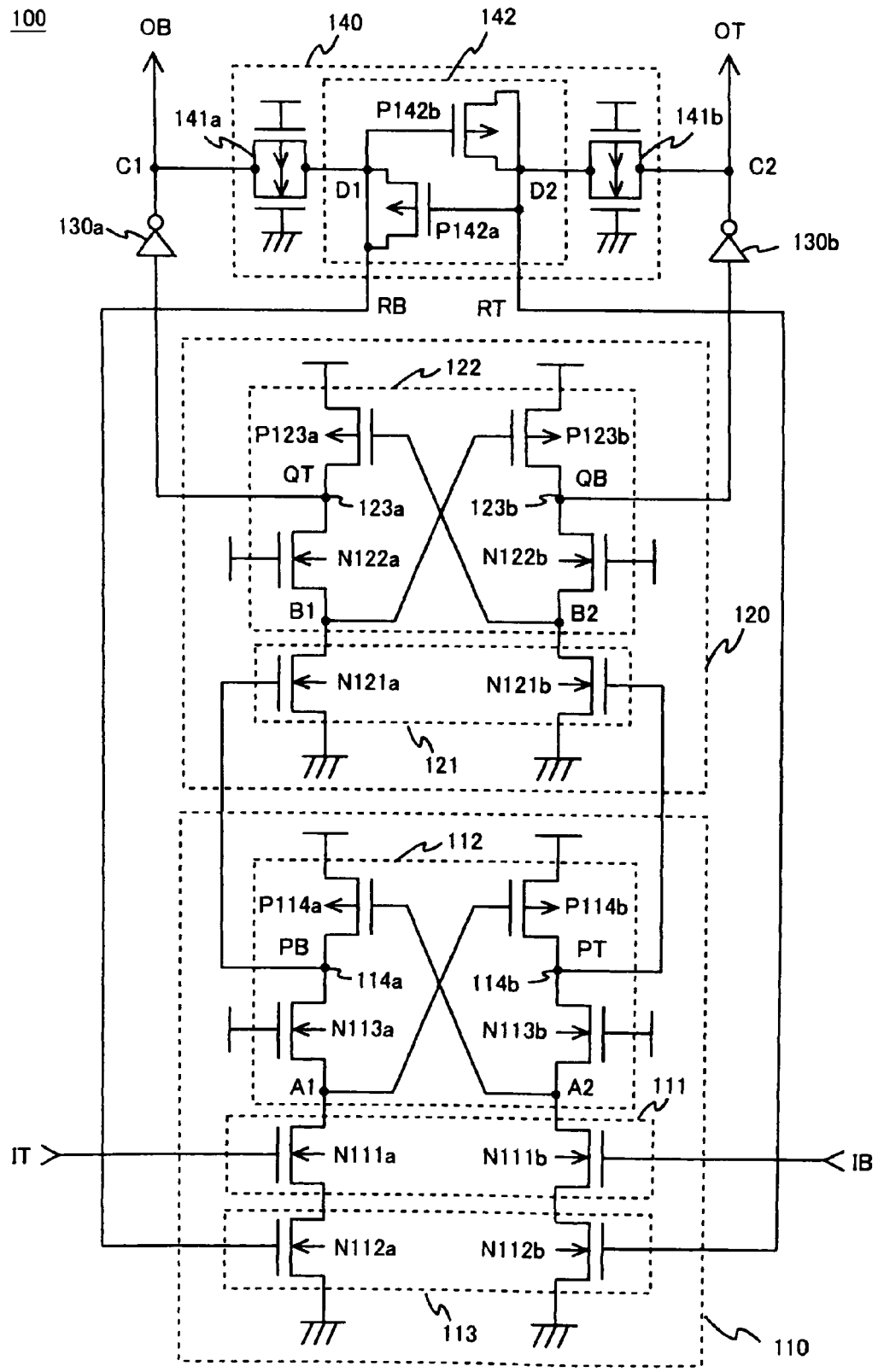
FIG. 2 shows a detailed circuit configuration of the semiconductor circuit according to the first embodiment.

FIG. 2 shows a detailed circuit configuration of the semiconductor circuit 100 shown in FIG. 1. The differential amplifier 110 includes a differential input section 111, a load resistance section 112, a load adjustment section 113, and differential signal output terminals 114a and 114b.

The differential input section 111 includes NMOS transistors N111a and N111b. The NMOS transistors N111a and N111b have gates receiving the input differential signals IT/IB, respectively, and drains connected to nodes A1 and A2, respectively. The load adjustment section 113 includes NMOS transistors N112a and N112b. The NMOS transistors N112a and N112b have gates receiving the voltage signals RB/RT, respectively, which are direct-current components from the low-pass filter 140. Further, the NMOS transistors N112a and N112b have drains connected to sources of the NMOS transistors N111a and N111b, respectively, and sources each connected to a ground terminal.

The load resistance section 112 includes NMOS transistors N113a and N113b. The NMOS transistors N113a and N113b have gates each receiving a predetermined voltage. Further, the NMOS transistors N113a and N113b have drains connected to the differential signal output terminals 114a and 114b, respectively, and sources connected to the nodes A1 and A2, respectively. The load resistance section 112 further includes PMOS transistors P114a and P114b. The PMOS transistors P114a and P114b have gates receiving potentials at the nodes A2 and A1, respectively. Further, the PMOS transistors P114a and P114b have sources each connected to a power supply voltage terminal, and drains connected to the differential signal output terminals 114a and 114b, respectively. The differential signal output terminals 114a and 114b output voltages as the differential signals PB/PT, respectively, to the differential amplifier 120. The voltages are generated by the load resistance section 112 with currents flowing through the transistors N111a and N111b of the differential input section 111 in accordance with the input differential signals IT/IB, respectively.

The differential amplifier 120 includes a differential input section 121, a load resistance section 122, and differential signal output terminals 123a and 123b. The differential amplifier 120 functions as a differential buffer to amplify and output the input differential signals.

The differential input section 121 includes NMOS transistors N121a and N121b. The NMOS transistors N121a and N121b have gates receiving the differential signals PB/PT, respectively, which are output from the differential amplifier 110. Further, the NMOS transistors N121a and N121b have sources each connected to the ground terminal, and drains connected to nodes B1 and B2, respectively. The load resistance section 122 includes NMOS transistors N122a and N122b. The NMOS transistors N122a and N122b have gates each receiving a predetermined voltage. Further, the NMOS transistors N122a and N122b have drains connected to the differential signal output terminals 123a and 123b, respectively, and sources connected to the nodes B1 and B2, respectively. The load resistance section 122 further includes PMOS transistors P123a and P123b. The PMOS transistors P123a and P123b have gates receiving potentials at the nodes B2 and B1, respectively. Further, the PMOS transistors P123a and P123b have sources each connected to the power supply voltage terminal, and drains connected to the differential signal output terminals 123a and 123b, respectively. The differential signal output terminals 123a and 123b output voltages as the differential signals QT/QB to the CMOS inverters 130a and 130b, respectively. The circuit configuration shown in FIG. 2 is similar to that of the differential amplifier 1900 of the related art, but the circuit may be realized in another circuit configuration.

The CMOS inverters 130a and 130b buffer and invert the differential signals QT/QB, respectively, and output the signals as the differential signals OB/OT to nodes C1 and C2, respectively.

The low-pass filter 140 includes transfer gates 141a and 141b and PMOS transistors P142a and P142b. The transfer gates 141a and 141b constitute a resistance section. The PMOS transistors P142a and P142b constitute a gate capacitance section 142. The transfer gate 141a is connected between the node C1 to which an output terminal of the CMOS inverter 130a is connected, and a node D1, and the transfer gate 141b is connected between the node C2 to which an output terminal of the CMOS inverter 130b is connected, and a node D2. The PMOS transistor P142a constituting the gate capacitance section 142 has a gate connected to the node D2, and a source and a drain that are connected to the node D1. In a similar manner, the PMOS transistor P142b constituting the gate capacitance section 142 has a gate connected to the node D1, and a source and a drain that are connected to the node D2.

In this case, the transfer gates 141a and 141b are used as resistor elements of the low-pass filter 140. Gate capacitances of the PMOS transistors P142a and P142b are used as capacitor elements of the low-pass filter 140. In other words, an RC low-pass filer is formed by a resistance value of each of the transfer gates 141a and 141b and a gate capacitance of each of the PMOS transistors P142a and P142b. As a result, the low-pass filter 140 can output voltages of the direct-current components, which are extracted from the differential signals OB/OT that are output signals of the semiconductor circuit 100, as the signals RB/RT.

Figure 3:
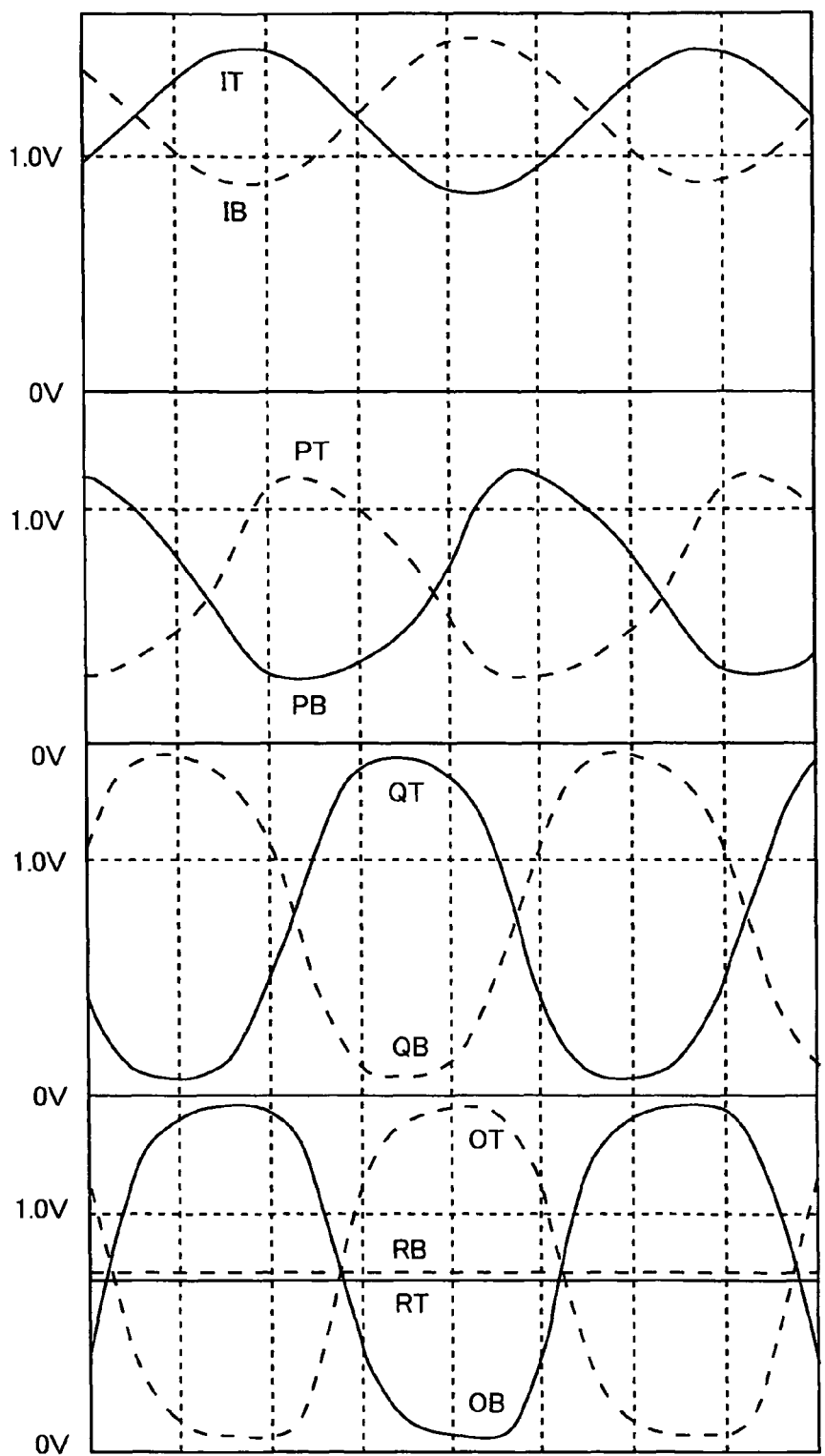
FIG. 3 shows operational waveforms of the semiconductor circuit according to the first embodiment.

Hereinafter, a description is given of operations of the circuit shown in FIG. 2 with reference to the waveform chart of FIG. 3. The input differential signals IT/IB shown in FIG. 3 are small-amplitude sine waves obtained by adding an offset between differential signals, that is, superimposing a predetermined offset voltage on the signal IB, which degrades the duty cycle of the signals. The input differential signals IT/IB input to the differential amplifier 110 serving as a first-stage differential amplifier of the semiconductor circuit 100 are amplified by the differential amplifier 110 and output as the differential signals PB/PT, respectively.

Further, the differential signals PB/PT input to the differential amplifier 120 serving as a second-stage differential amplifier are amplified by the differential amplifier 120 and output as the differential signals QT/QB, respectively. Furthermore, the differential signals QT/QB are inverted into the differential signals OB/OT of the CMOS level by the third-stage CMOS inverters 130a and 130b, respectively, and the differential signals are output as a final output of the semiconductor circuit 100.

Further, a DC voltage component is extracted from each of the differential signals OB/OT by the low-pass filter 140, and the signals RB/RT, which are DC voltages, are output. In this case, when the duty cycle of the differential signals OB/OT is degraded, the potentials of the signals RB/RT, which are DC voltages, fluctuate in accordance with the amount of degradation in duty cycle.

For example, the duty cycle of the input differential signals IT/IB shown in FIG. 3 is degraded since the offset is added to the signal IB as described above. As a result, the duty cycle of the differential signals OB/OT is also degraded. Thus, as shown in FIG. 3, the potential of the signal RT, which is an output from the low-pass filter 140, becomes lower than the potential of the signal RB. The signals RB/RT are fed back to the load adjustment section 113 of the differential amplifier 110 serving as the first-stage differential amplifier of the semiconductor circuit 100. Then, the load adjustment section 113 adjusts the offset of the input of the differential input section 111 by using the signals RB/RT. Through the adjustment, the offset of the input of the signal IB is reduced, whereby the degradation in duty cycle due to the offset added to the signal IB is reduced. As a result, the degradation in duty cycle of the differential signals PB/PT, which are output signals of the differential amplifier 110, is corrected.

The corrected differential signals PB/PT are input to the second-stage differential amplifier 120, and are then output as differential signals QT/QB. Further, the differential signals QT/QB are input to the CMOS inverters 130a and 130b, respectively, and are then output as the differential signals OB/OT. Thus, the degradation in duty cycle of the differential signals OB/OT that are output from the CMOS inverters 130a and 130b, respectively, as the final output of the semiconductor circuit 100 is also corrected.

In this case, as described above, the semiconductor circuit 100 feeds back the signals RB/RT corresponding to the differential signals OB/OT of the final output, to the first-stage differential amplifier 110. Thus, the correction is effective not only for the degradation in duty cycle of the input differential signals IT/IB, but also for the degradation in duty cycle due to the relative variations among transistors constituting the differential amplifiers 110 and 120 and the CMOS inverters 130a and 130b. For example, consideration is given to a case where the input differential signals IT/IB, the duty cycle of which is not degraded, are input, while the duty cycle of the differential signals OB/OT is degraded due to the relative variations among transistors constituting the differential amplifiers 110 and 120. In this case, the signals RB/RT extracted from the differential signals OB/OT by the low-pass filter 140 fluctuate according to the offset generated by the differential amplifiers 110 and 120. As a result, the signals RB/RT, which are fed back to the differential amplifier 110, control the offset of the input of the differential input section 111 to cause the load adjustment section 113 to reduce the offset.

As described above, the semiconductor circuit 100 according to the first embodiment of the present invention outputs the differential signals OB/OT as the final output of the circuit. The differential signals OB/OT are input to the low-pass filter 140, and then the signals RB/RT as the DC voltage components are extracted. The semiconductor circuit 100 causes the signals RB/RT to be fed back to the first-stage differential amplifier of the circuit to adjust the offset of the input, thereby correcting the degradation in duty cycle of the differential signals OB/OT as the final output signals. The semiconductor circuit 100 is capable of correcting not only the degradation in duty cycle of the input differential signals IT/IB input to the semiconductor circuit 100, but also the degradation in duty cycle due to the relative variations among transistors constituting the semiconductor circuit 100. Accordingly, as compared with the prior art in which only the degradation in duty cycle of the input differential signal is effectively corrected, the semiconductor circuit 100 is capable of enhancing the effect of correcting the degradation in duty cycle of the output signals. Further, since only the low-pass filter 140 and the load adjustment section 113 are added in the first embodiment, an increase in circuit scale is suppressed. Further, the circuit according to the first embodiment has advantages in that the low-pass filter 140 and the load adjustment section 113 have low power consumption, for example.

Figure 4:
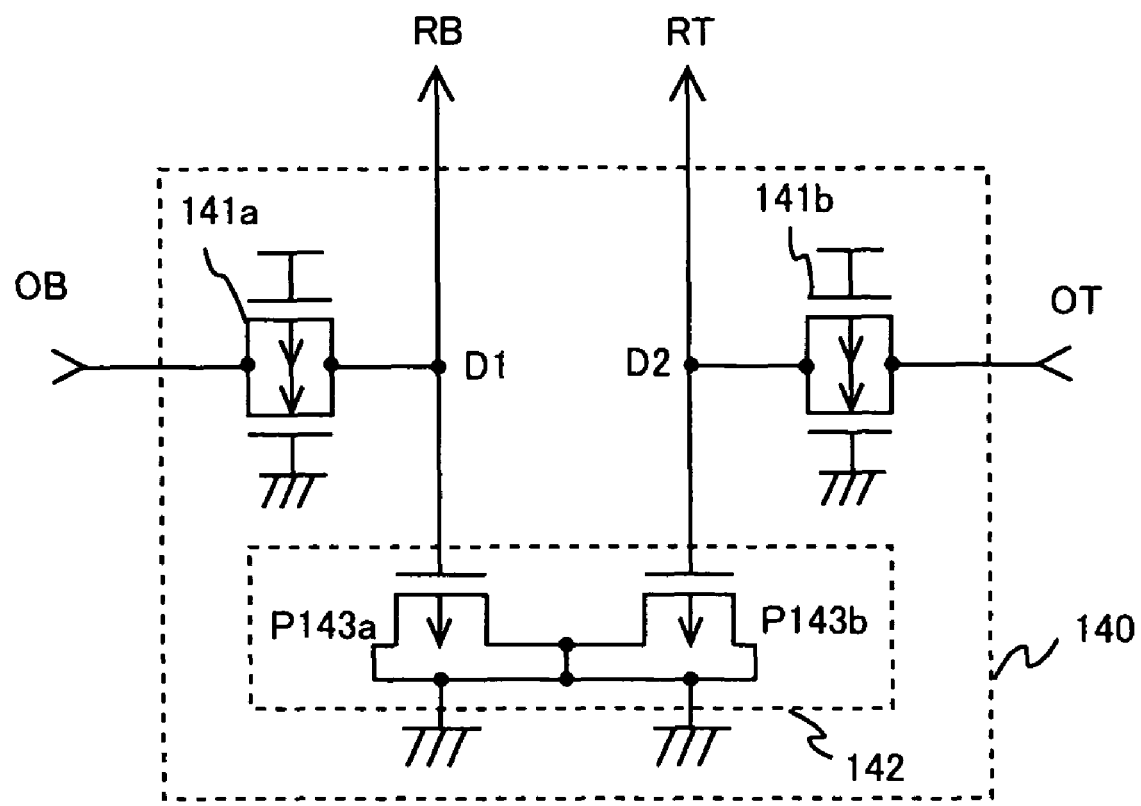
FIG. 4 shows a circuit configuration of a low-pass filter of the semiconductor circuit according to the first embodiment.
Figure 5:
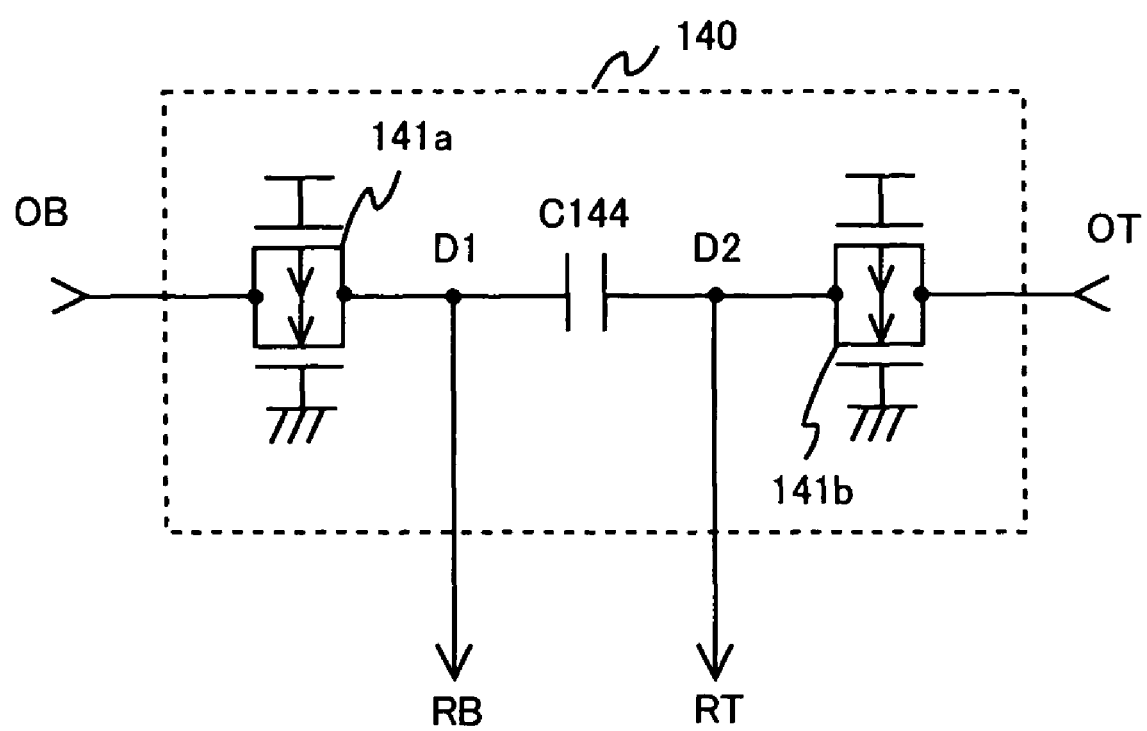
FIG. 5 shows another circuit configuration of the low-pass filter of the semiconductor circuit according to the first embodiment.
Figure 6:
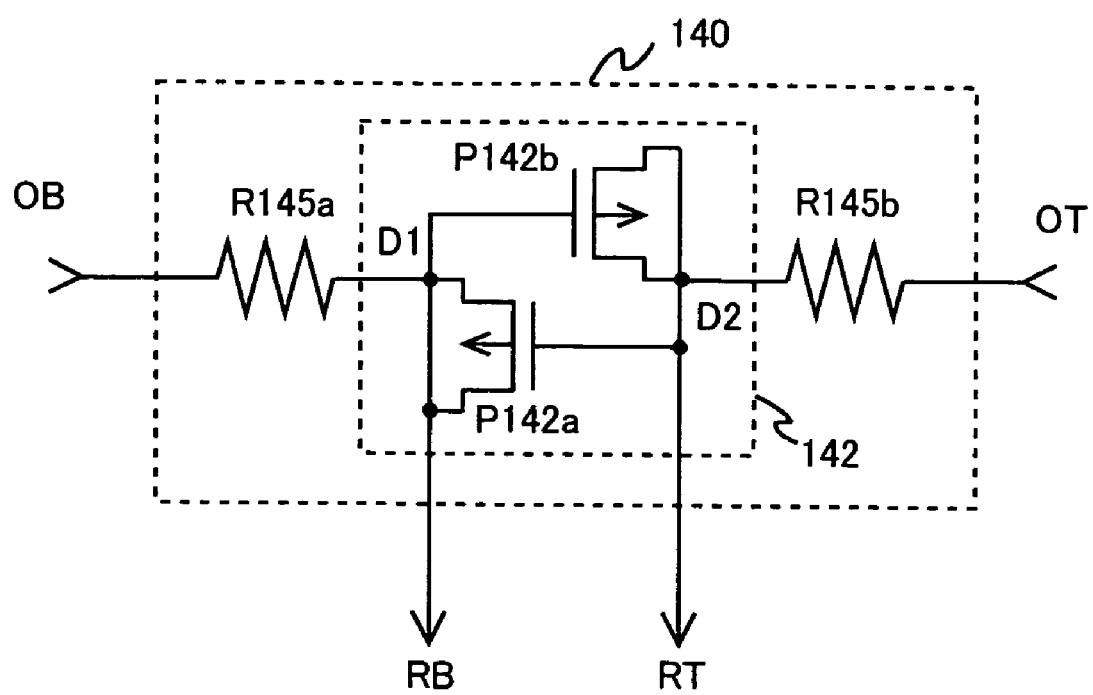
FIG. 6 shows still another circuit configuration of the low-pass filter of the semiconductor circuit according to the first embodiment.

Next, as a modified example of the first embodiment, the low-pass filter 140 may be configured as shown in FIGS. 4, 5, and 6. As shown in FIG. 4, a source and a drain of each of PMOS transistors P143a and P143b, which constitute the gate capacitance section 142, may be connected to the ground terminal. Further, as shown in FIG. 5, a capacitor element C144 may be used instead of the gate capacitance section 142 of the PMOS transistors. Furthermore, as shown in FIG. 6, resistor elements R145a and R145b may be used instead of the transfer gates 141a and 141b. The PMOS transistors constituting the gate capacitance section 142 may be replaced with NMOS transistors. For example, resistor elements R145a and R145b may be used instead of the transfer gates 141a and 141b, and the capacitor element C144 may be used instead of the gate capacitance section 142. Thus, it is possible to use a combination of a plurality of the above-mentioned configuration examples at the same time.

Figure 7:
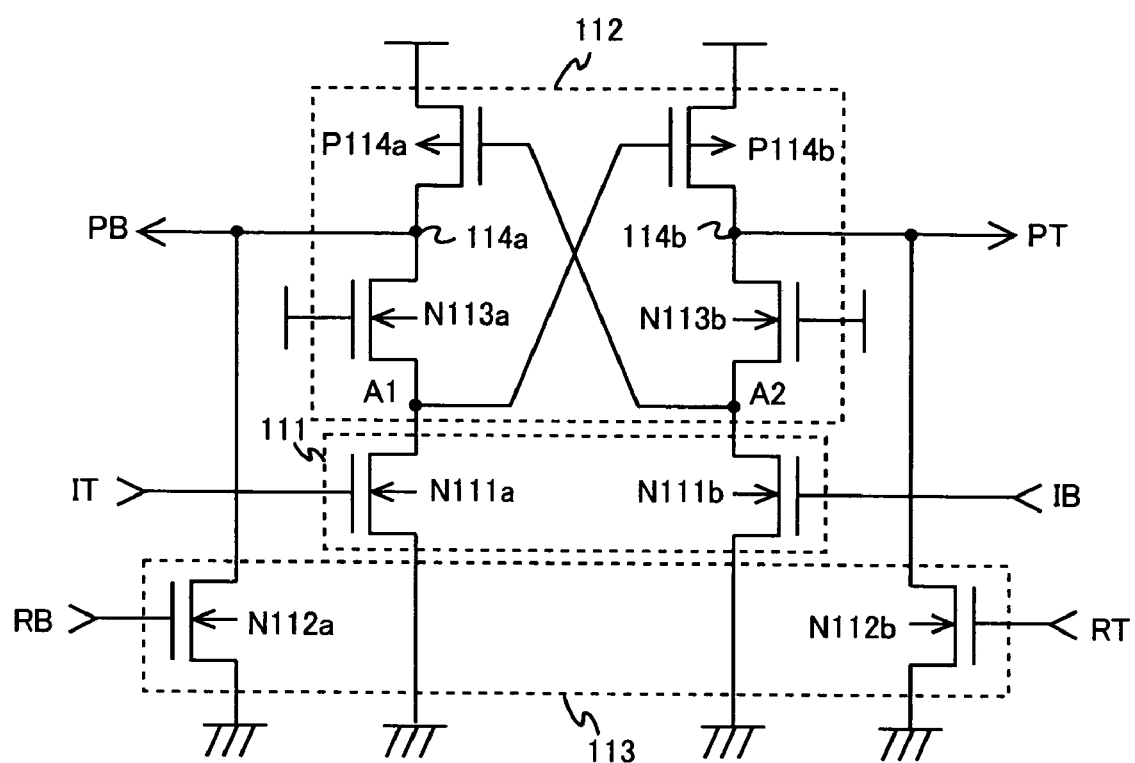
FIG. 7 shows a circuit configuration of a differential amplifier of the semiconductor circuit according to the first embodiment.
Figure 8:
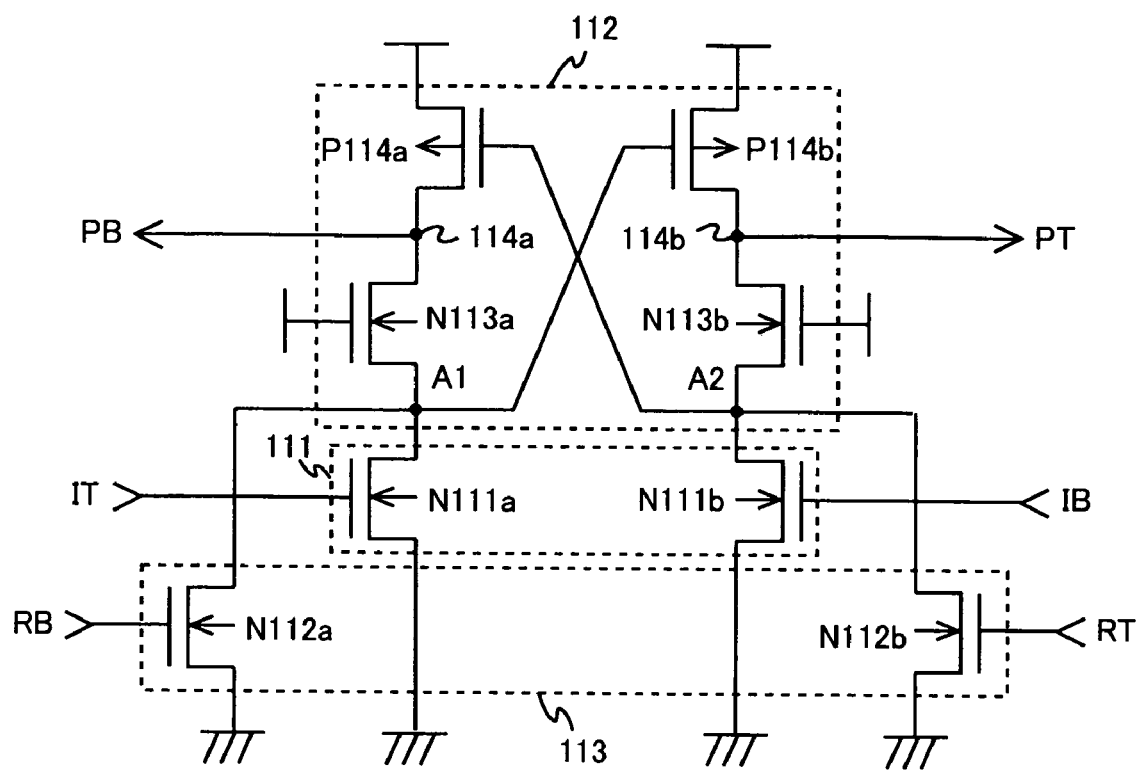
FIG. 8 shows another circuit configuration of the differential amplifier of the semiconductor circuit according to the first embodiment.
Figure 9:
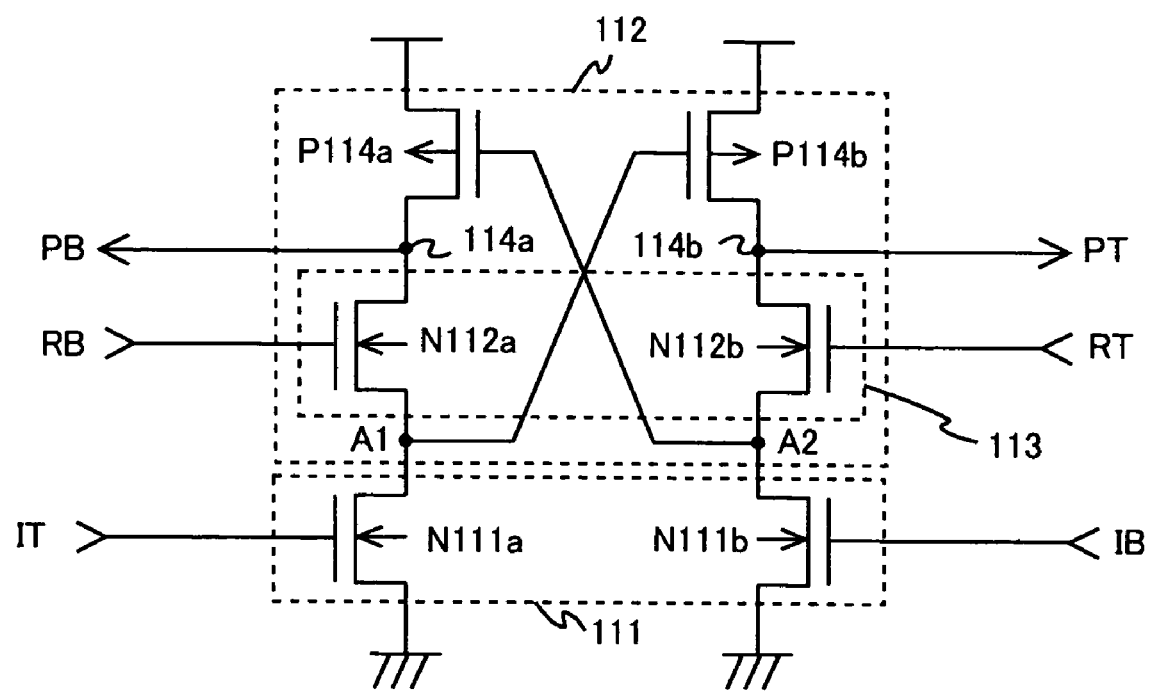
FIG. 9 shows still another circuit configuration of the differential amplifier of the semiconductor circuit according to the first embodiment.
Figure 10:
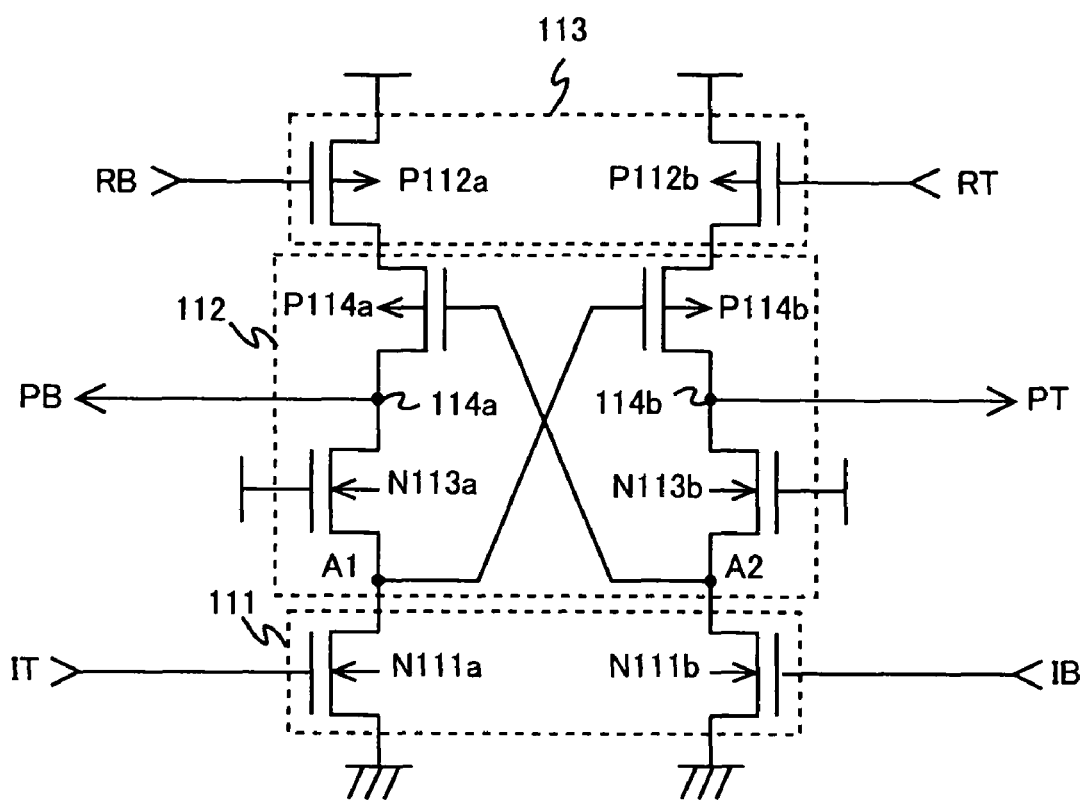
FIG. 10 shows yet another circuit configuration of the differential amplifier of the semiconductor circuit according to the first embodiment.
Figure 11:
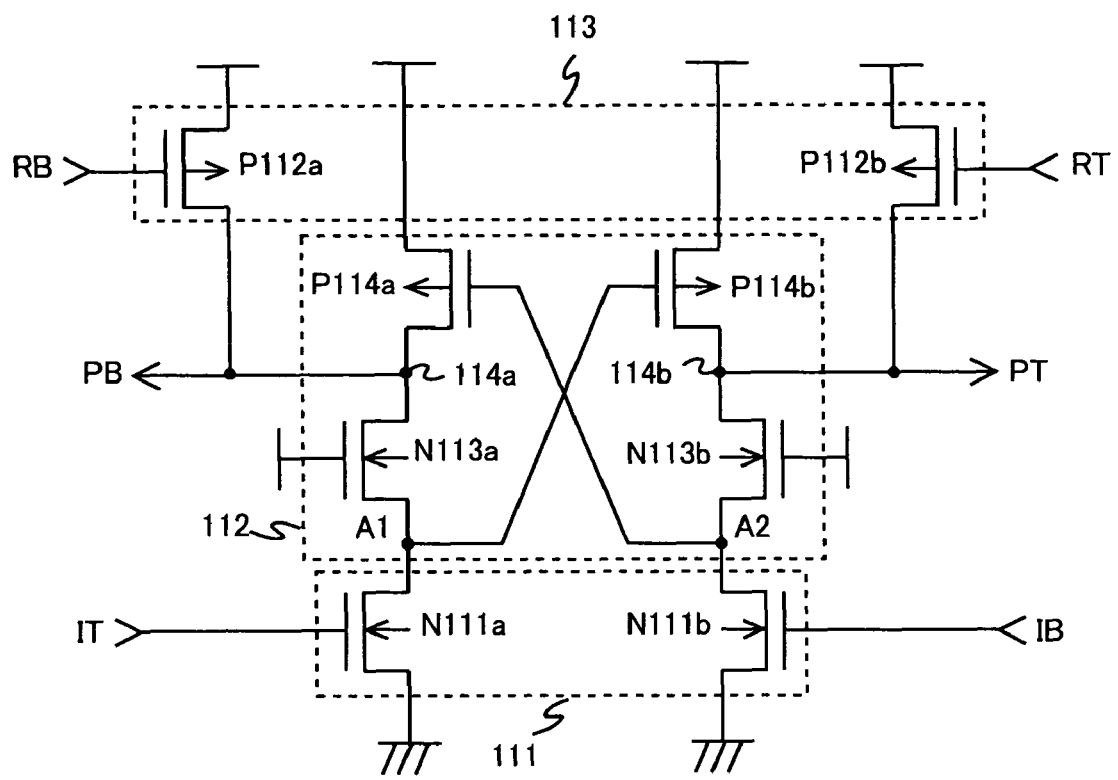
FIG. 11 shows further another circuit configuration of the differential amplifier of the semiconductor circuit according to the first embodiment.

Further, as another modified example of the first embodiment, the first-stage differential amplifier 110 may be configured as shown in FIGS. 7 to 17. In FIG. 2, the load adjustment section 113 is connected in series with the differential input section 111 and the load resistance section 112, but the load adjustment section 113 may be connected in parallel with the differential input section 111 and the load resistance section 112 as shown in FIG. 7. In other words, the NMOS transistor N112a constituting the load adjustment section 113 is connected between the differential signal output terminal 114a and the ground terminal, and the NMOS transistor N112b constituting the load adjustment section 113 is connected between the differential signal output terminal 114b and the ground terminal. In the circuit configuration shown in FIG. 7, operations and a duty correction operation similar to those of the circuit configuration shown in FIG. 2 are obtained. As compared with the circuit configuration shown in FIG. 2, the number of stages of vertically stacked transistors is reduced, which is disadvantageous in that current consumption increases but is advantageous in that the transistors can be operated at low power supply voltage. In FIG. 8, the load adjustment section 113 is connected between the nodes A1 and A2 and the ground terminal. In FIG. 9, the transistors N113a and N113b are replaced with the transistors N112a and N112b of the load adjustment section 113. In FIG. 10, the load adjustment section 113 is made up of the PMOS transistors P112a and P112b. The PMOS transistor P112a is connected between the power supply voltage terminal and the transistor P114a, and the PMOS transistor P112b is connected between the power supply voltage terminal and the transistor P114b. In FIG. 11, in a similar manner as in the circuit shown in FIG. 10, the load adjustment section 113 is made up of the PMOS transistors P112a and P112b. The PMOS transistor P112a is connected between the differential signal output terminal 114a and the power supply voltage terminal, and the PMOS transistor P112b is connected between the differential signal output terminal 114b and the power supply voltage terminal.

Figure 12:
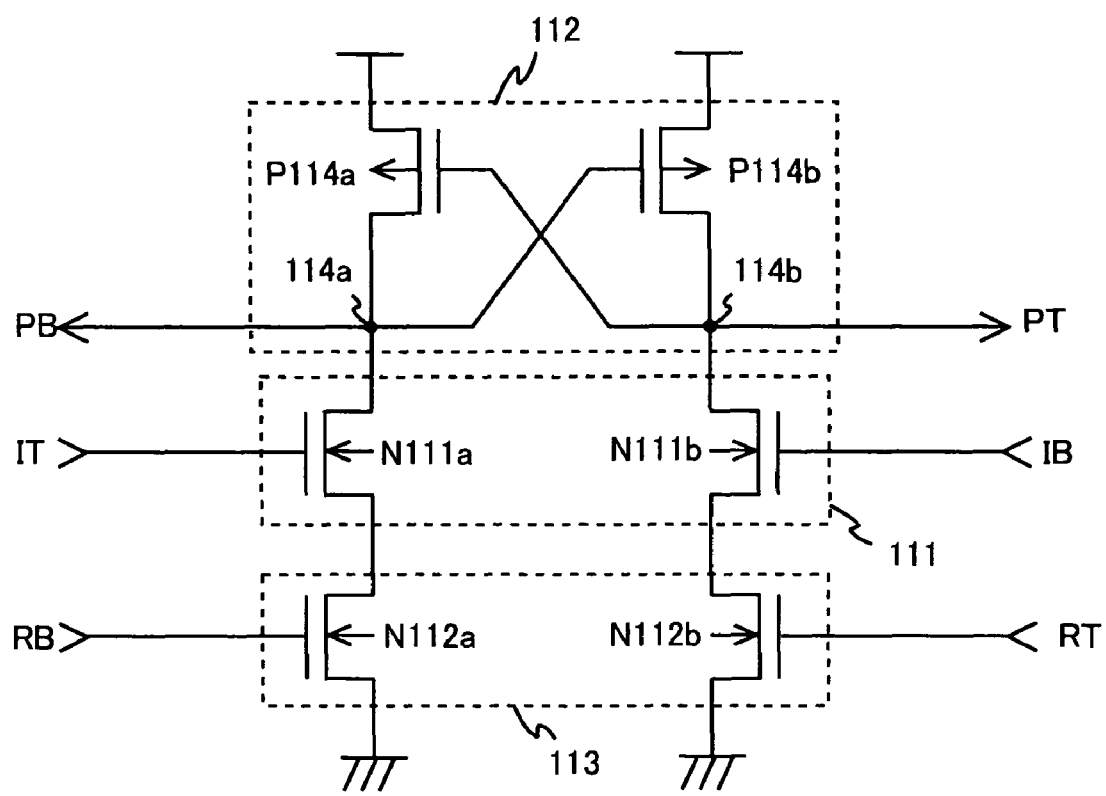
FIG. 12 shows further another circuit configuration of the differential amplifier of the semiconductor circuit according to the first embodiment.
Figure 13:
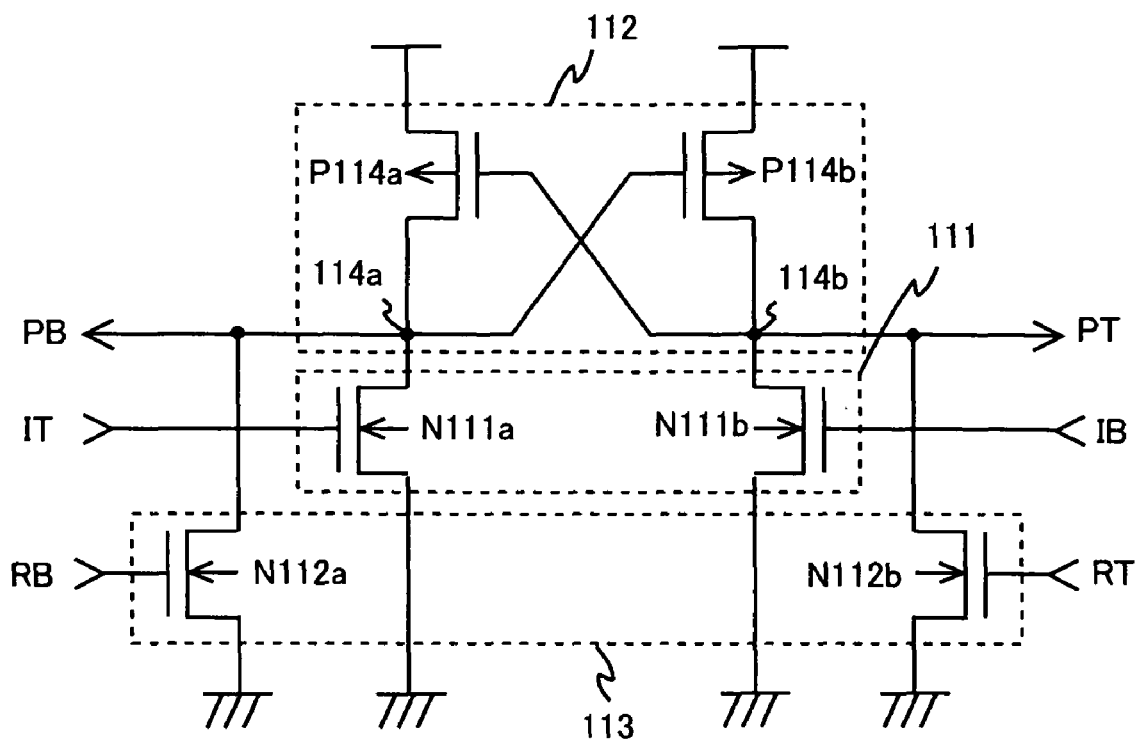
FIG. 13 shows further another circuit configuration of the differential amplifier of the semiconductor circuit according to the first embodiment.
Figure 14:
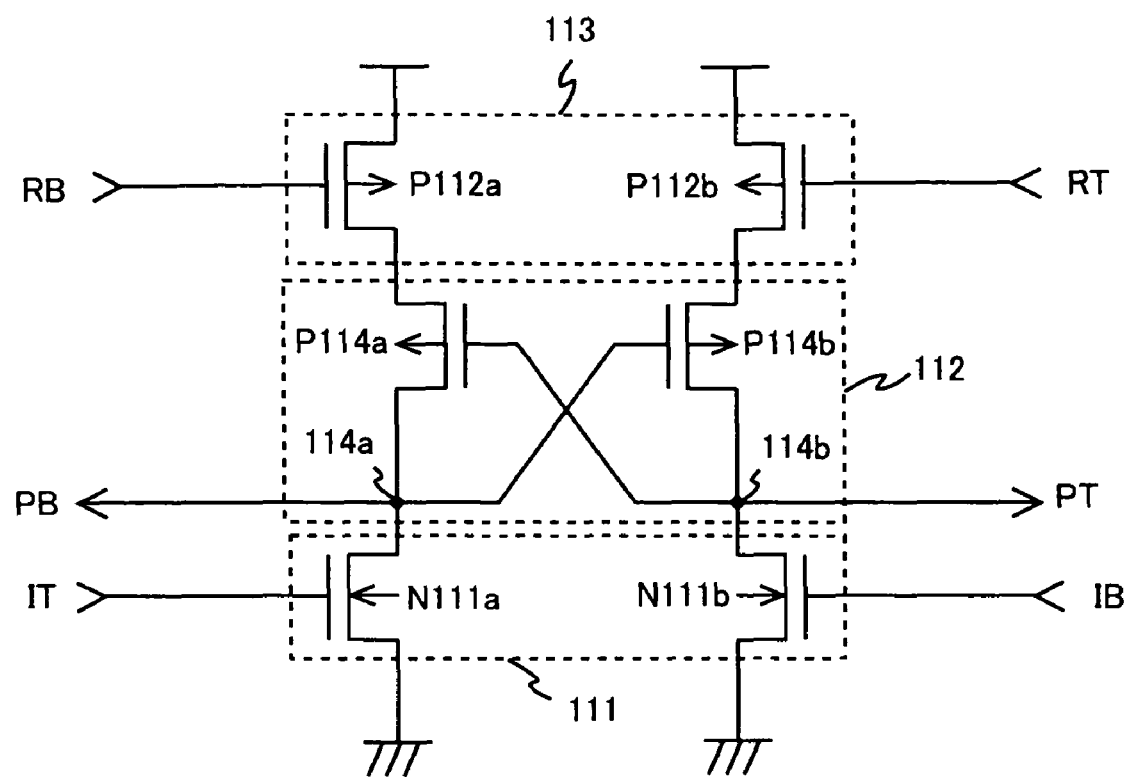
FIG. 14 shows further another circuit configuration of the differential amplifier of the semiconductor circuit according to the first embodiment.
Figure 15:
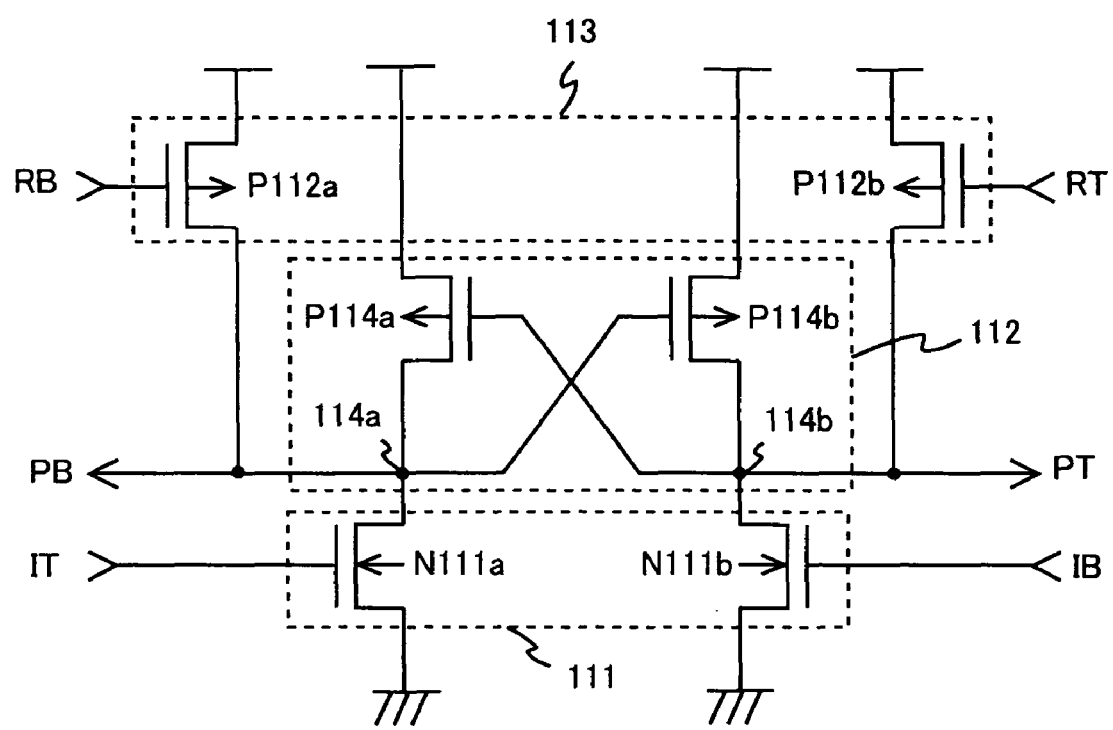
FIG. 15 shows further another circuit configuration of the differential amplifier of the semiconductor circuit according to the first embodiment.

In FIG. 12, the load resistance section 112 is made up of the PMOS transistors P114a and P114b. The gate of the PMOS transistor P114a is connected to the differential signal output terminal 114b, and the gate of the PMOS transistor P114b is connected to the differential signal output terminal 114a. The load resistance section 112 is connected in series with the differential input section 111 and the load adjustment section 113. In FIG. 13, though the load resistance section 112 and the differential input section 111 have configurations similar to those of FIG. 12, the NMOS transistor N112a of the load adjustment section 113 is connected between the differential signal output terminal 114a and the ground terminal, and the NMOS transistor N112b of the load adjustment section 113 is connected between the differential signal output terminal 114b and the ground terminal. In FIG. 14, though the load resistance section 112 and the differential input section 111 have configurations similar to those of FIG. 12, the load adjustment section 113 is made up of the PMOS transistors P112a and P112b, and the PMOS transistors P112a and P112b are connected between the power supply voltage terminal and the load resistance section 112. In FIG. 15, though the load resistance section 112 and the differential input section 111 have configurations similar to those of FIG. 12, the load adjustment section 113 is made up of the PMOS transistors P112a and P112b. In addition, the PMOS transistor P112a is connected between the differential signal output terminal 114a and the power supply voltage terminal, and the PMOS transistor P112b is connected between the differential signal output terminal 114b and the power supply voltage terminal.

Figure 16:
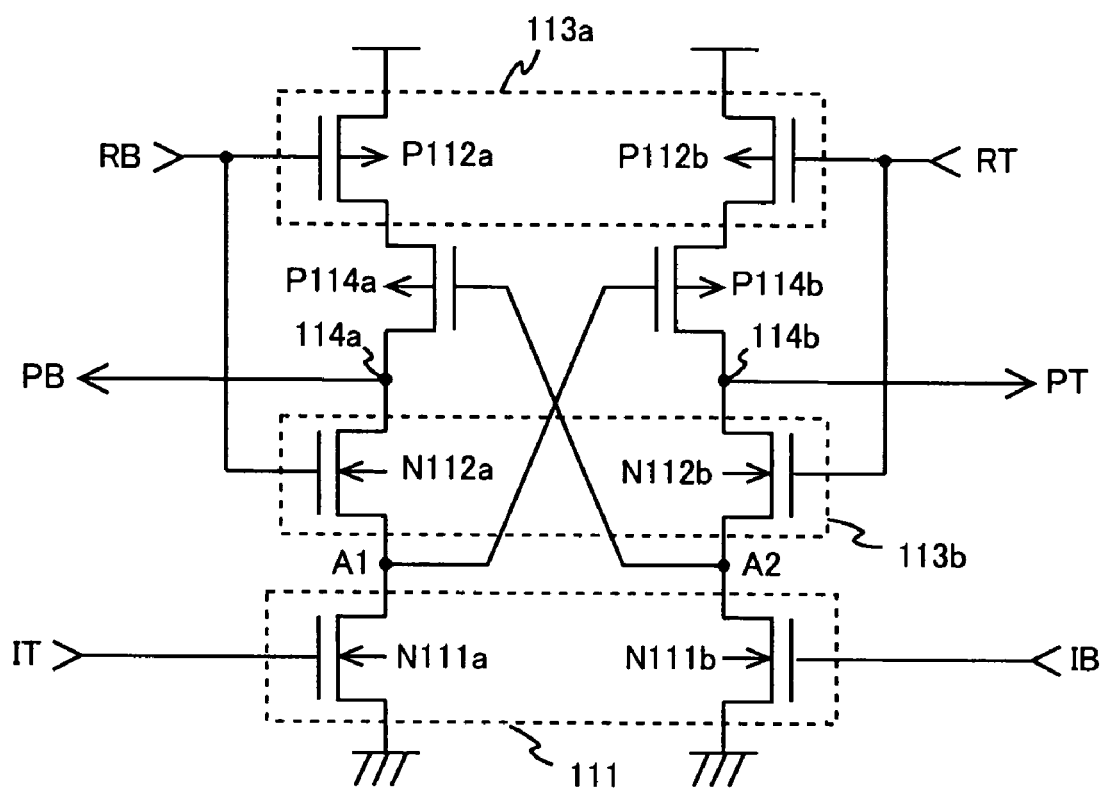
FIG. 16 shows further another circuit configuration of the differential amplifier of the semiconductor circuit according to the first embodiment.

As still another modified example of the first embodiment, the circuits shown in FIGS. 9 and 10 may be combined with each other as shown in FIG. 16, and a plurality of load adjustment sections such as load adjustment sections 113a and 113b may be employed.

Figure 17:
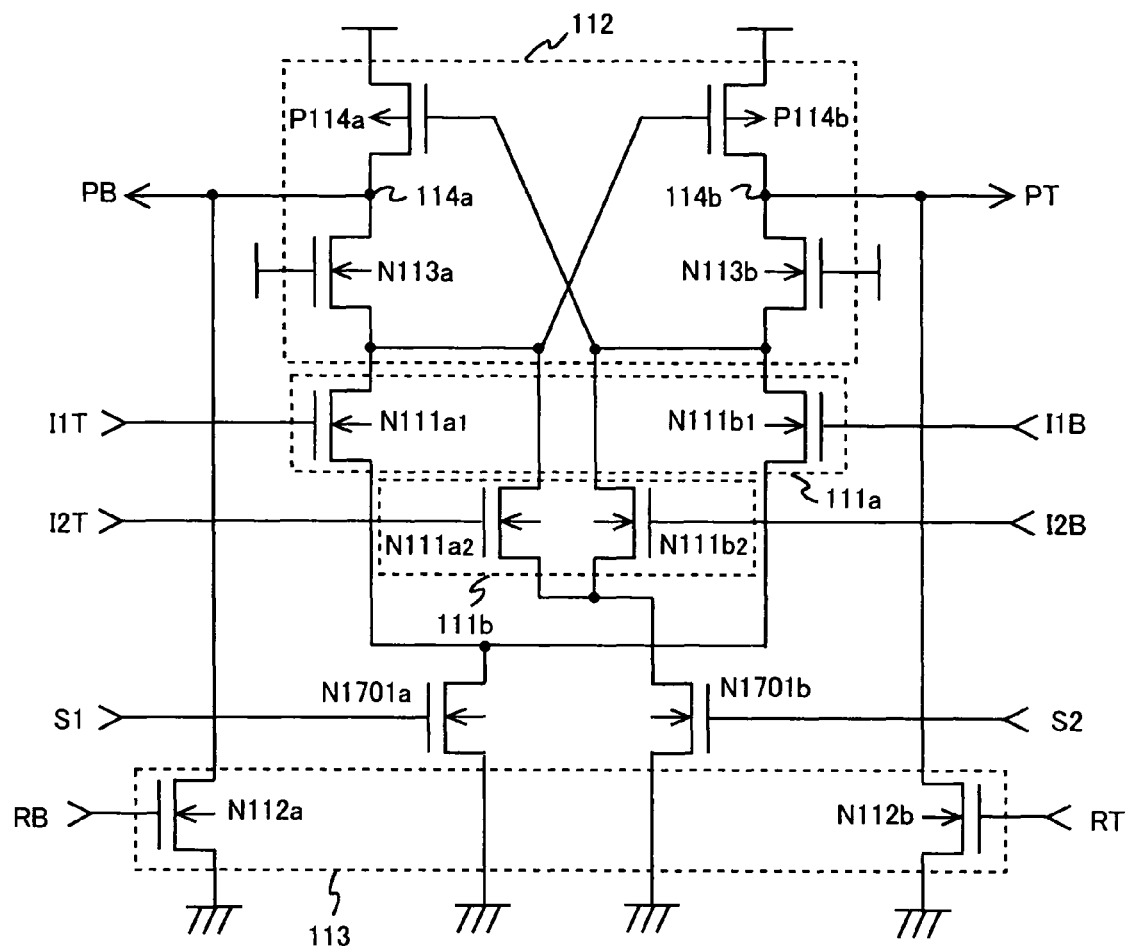
FIG. 17 shows further another circuit configuration of the differential amplifier of the semiconductor circuit according to the first embodiment.
Figure 18:
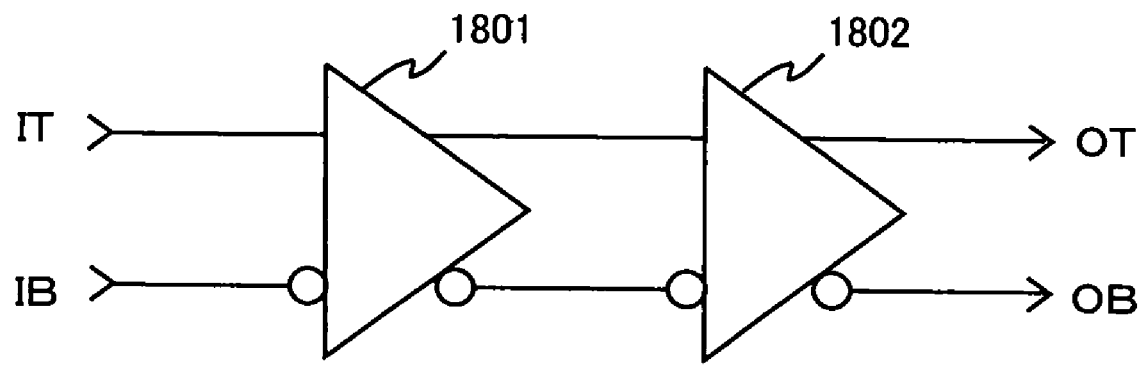
FIG. 18 shows a schematic configuration of a semiconductor circuit according to a related art.
Figure 19:
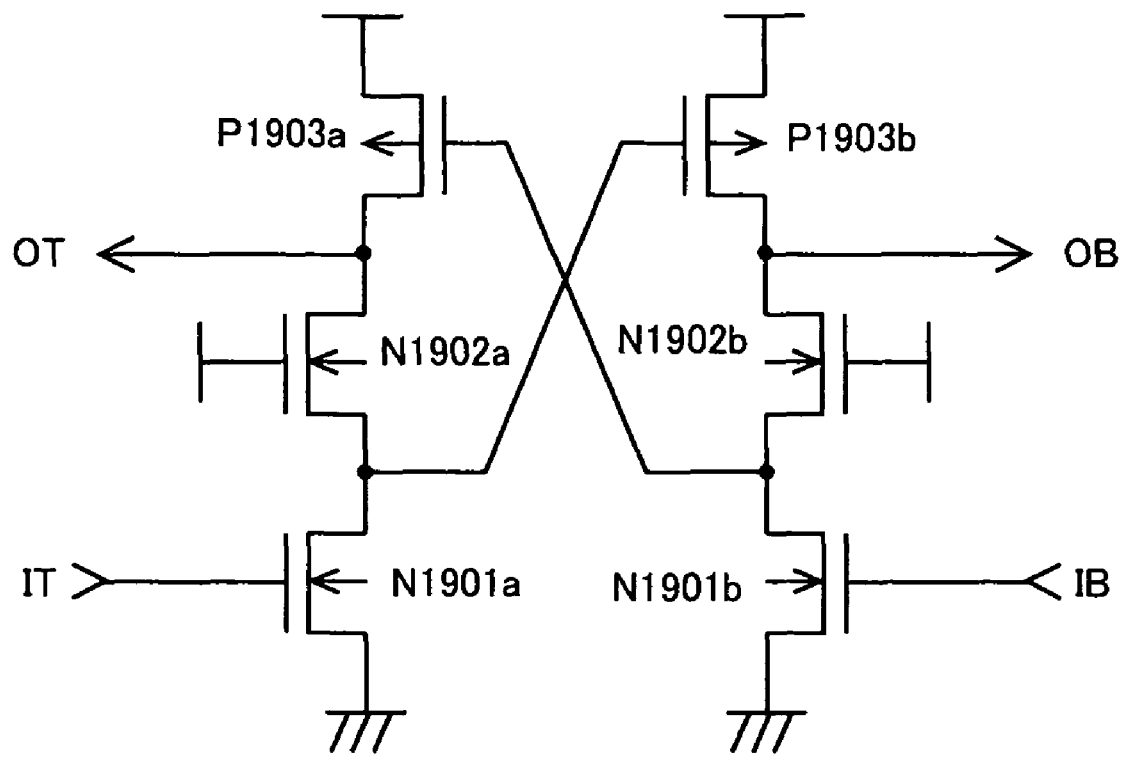
FIG. 19 shows a detailed circuit configuration of a semiconductor circuit according to a prior art.
Figure 20:
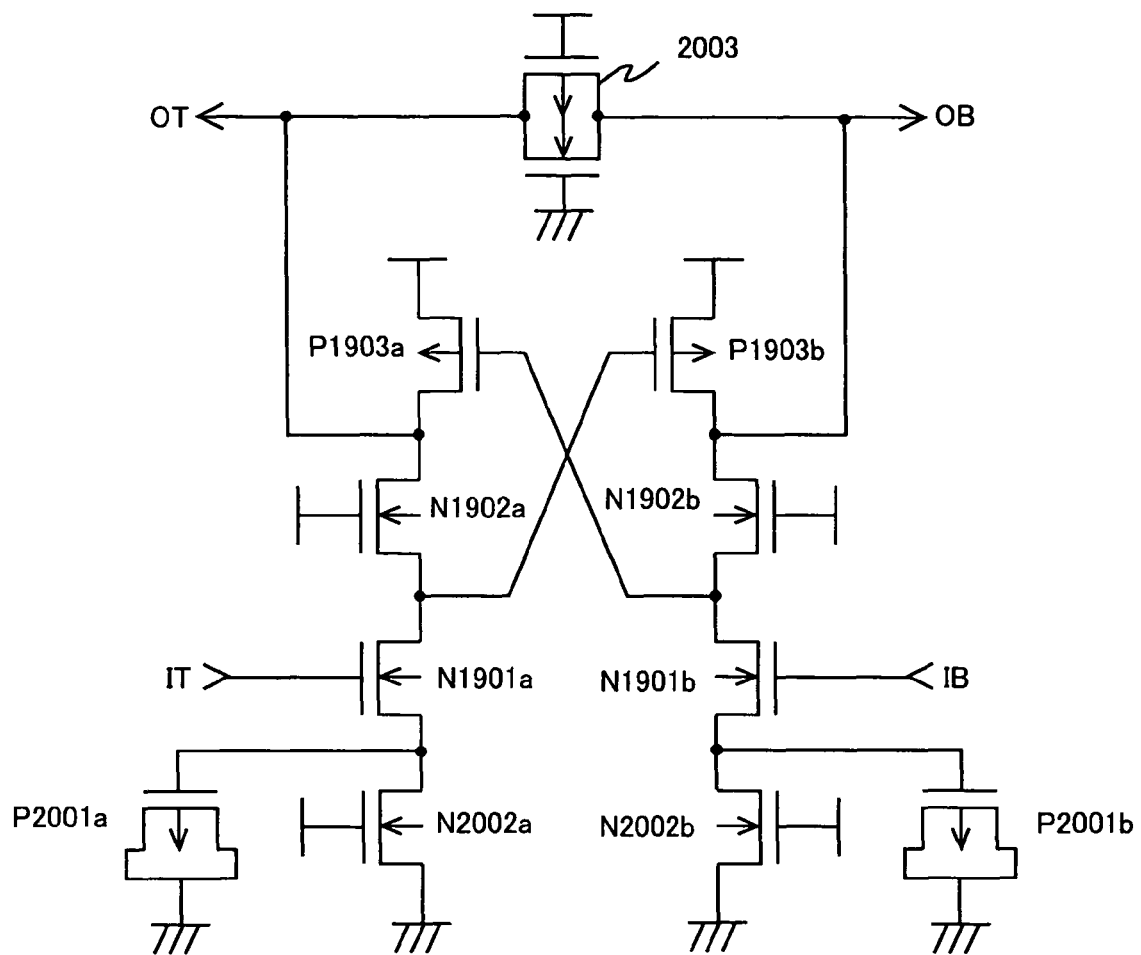
FIG. 20 shows a circuit configuration of a differential amplifier of a semiconductor circuit according to a prior art.
Figure 21:
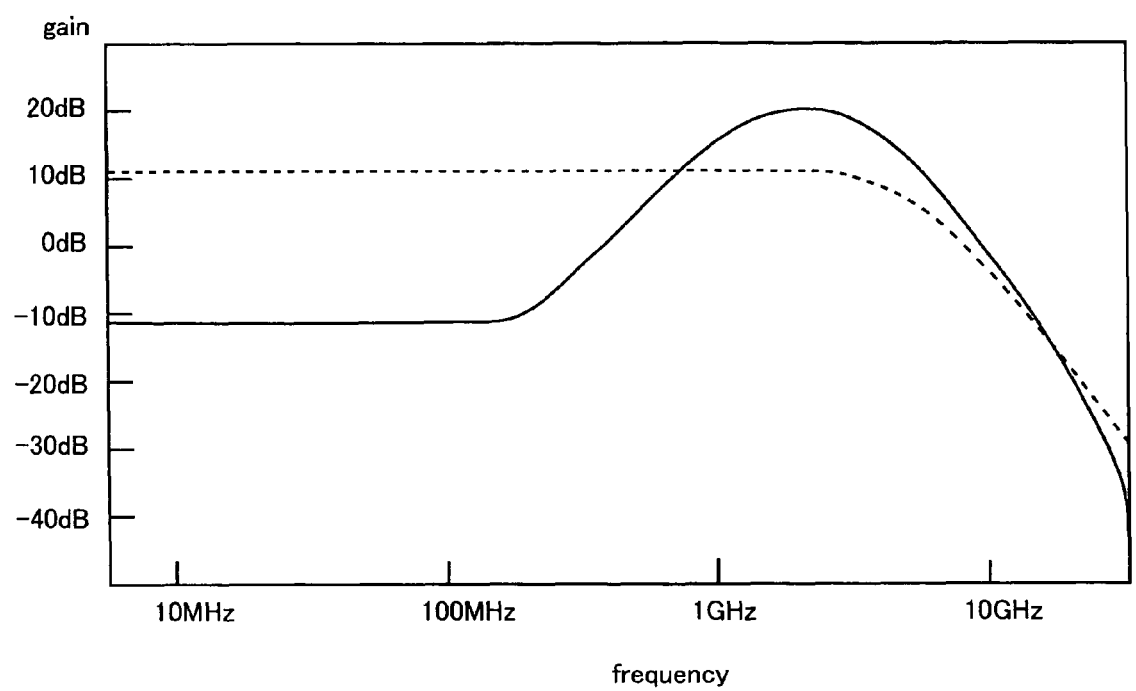
FIG. 21 shows a circuit configuration of the differential amplifier of the semiconductor circuit according to the related art.
Figure 22:
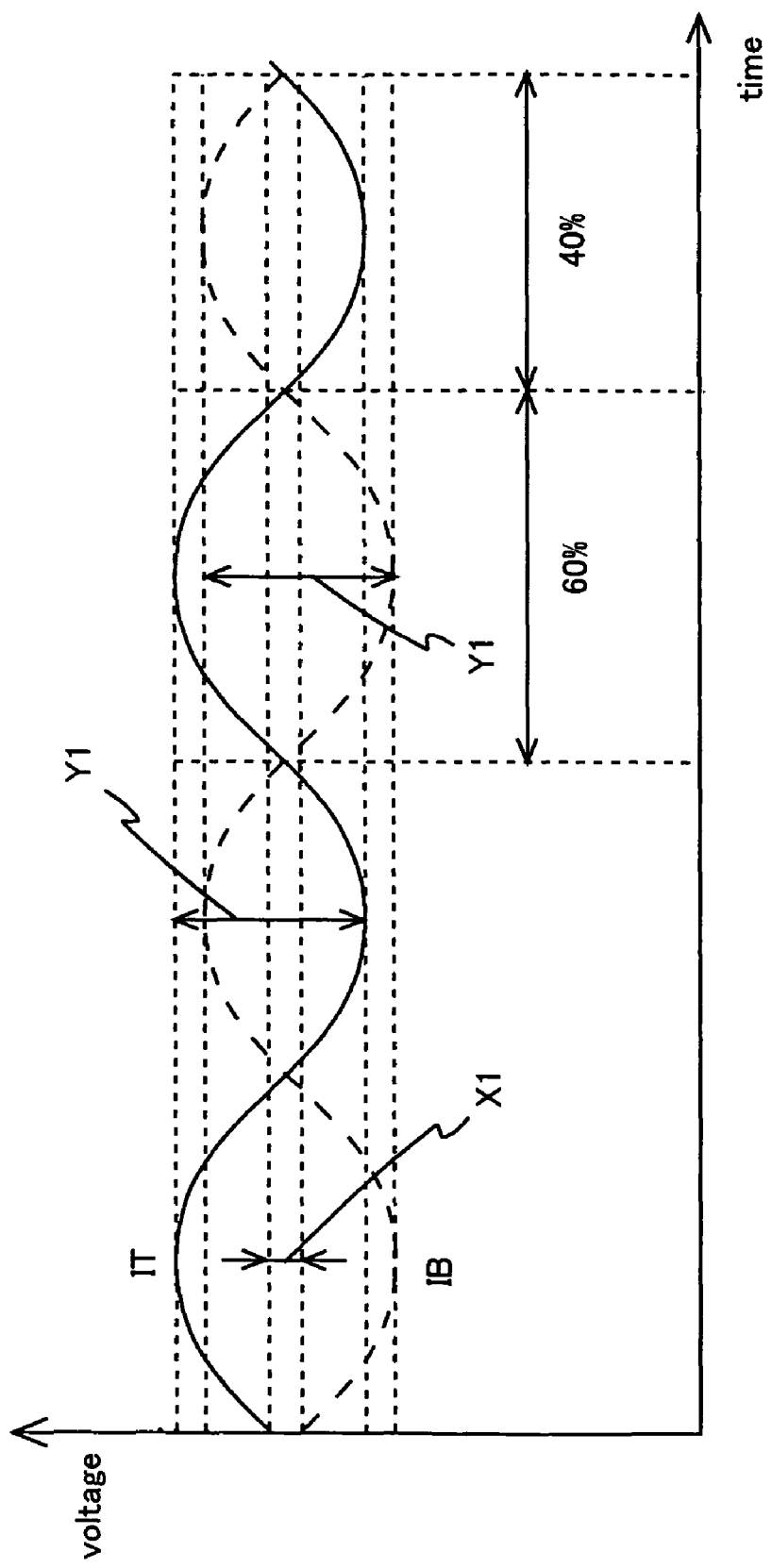
FIG. 22 shows a differential signal input to the semiconductor circuit according to the related art.
Figure 23:
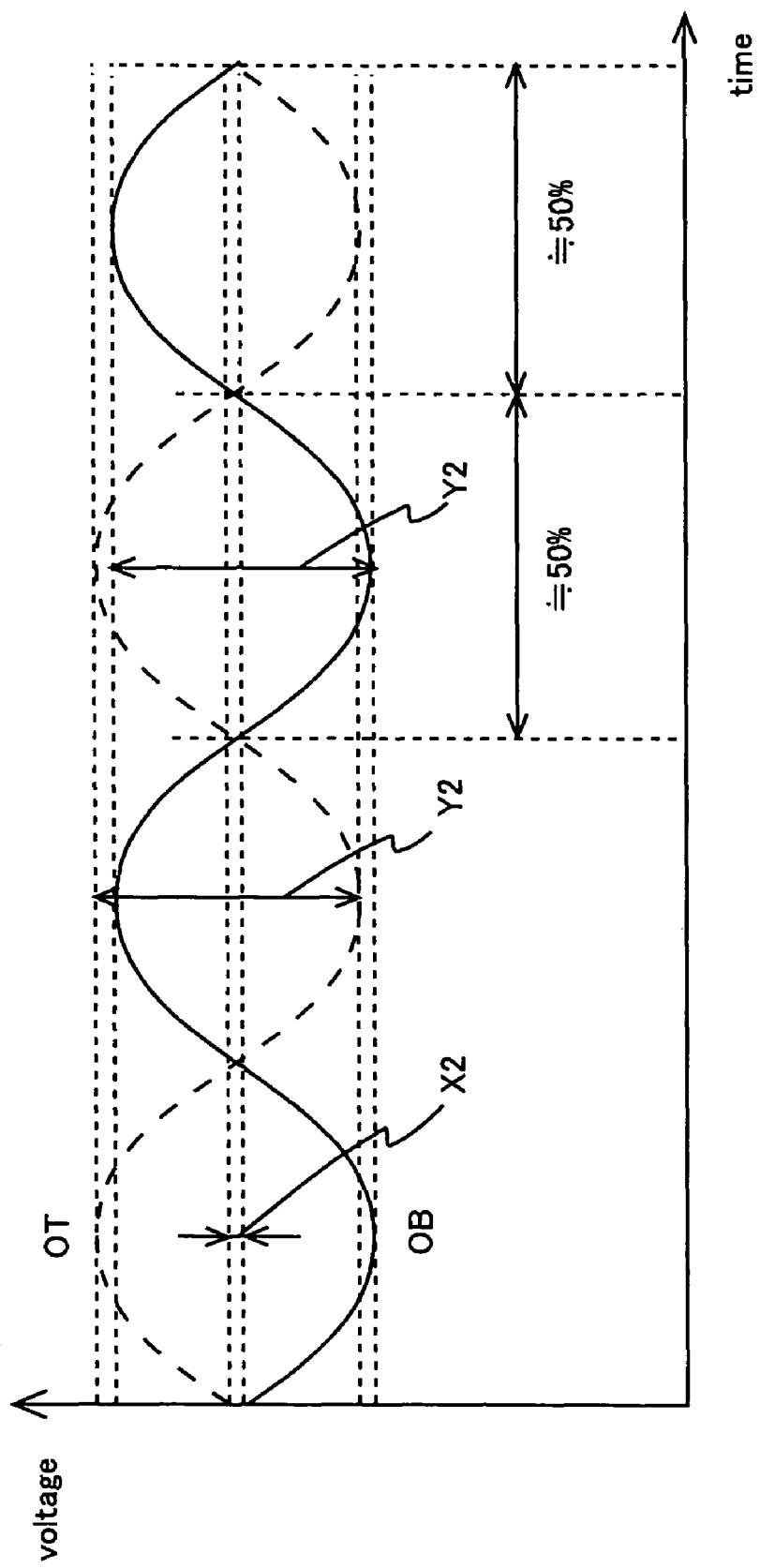
FIG. 23 shows a differential signal output from the semiconductor circuit according to the related art.

Further, the differential amplifier 110 may input a plurality of differential signals as well as a pair of input differential signals. For example, as shown in FIG. 17, it is possible to employ a circuit configuration in which two pairs of input differential signals I1T/I1B and I2T/I2B are received and control is executed so as to select one of the two pairs of input differential signals in response to control signals S1/S2.

Note that the present invention is not limited to the above embodiments, but can be appropriately modified without departing from the gist of the present invention. For example, instead of the three-stage configuration in which the differential amplifier 110 is connected with the differential amplifier 120 and the CMOS inverters 130a and 130b as shown in FIG. 2, only one stage of the differential amplifier 110 may be used, or a plurality of differential buffers such as the differential amplifier 120 connected to the differential amplifier 110, may be connected to each other to form an odd number of multiple stages. Such a multistage configuration is suitable for a case where the input differential signal has a smaller amplitude and a case where a larger output load is driven. Further, the conductivity type of each transistor constituting a circuit may be reversed.

It is apparent that the present invention is not limited to the above embodiments, but may be modified and changed without departing from the scope and spirit of the invention.

What is claimed is:

1. A semiconductor circuit, comprising:
   a differential input section to receive input differential signals;
   a load resistance section to output a voltage according to a current output by the differential input section;
   differential signal output terminals to output a differential signal corresponding to the voltage output from the load resistance section;
   a low-pass filter to extract a direct-current component of the differential signal output from the differential signal output terminals; and
   a load adjustment section to feed back the direct-current component extracted by the low-pass filter to adjust a resistance value of the load resistance section,
   wherein the differential input section includes:
      a first transistor having a gate receiving one of the input differential signals; and
      a second transistor having a gate receiving another of the input differential signals,
   wherein the load resistance section includes:
      a third transistor connected between a first node connected to a drain of the first transistor, and one of the differential signal output terminals;
      a fourth transistor connected between a second node connected to a drain of the second transistor, and another of the differential signal output terminals;
      a fifth transistor having a drain connected to the one of the differential signal output terminals, and a gate connected to the second node; and
      a sixth transistor having a drain connected to the another of the differential signal output terminals, and a gate connected to the first node.

2. The semiconductor circuit according to claim 1, further comprising a plurality of stages of differential buffers connected between the differential signal output terminals and the low-pass filter.

3. The semiconductor circuit according to claim 1, wherein:
   the load adjustment section is connected to a ground terminal;
   the load resistance section is connected to a power supply voltage terminal; and
   the differential input section is connected between the load resistance section and the load adjustment section.

4. The semiconductor circuit according to claim 1, wherein:
   the load adjustment section is connected to a power supply voltage terminal;
   the differential input section is connected to a ground terminal; and
   the load resistance section is connected between the load adjustment section and the differential input section.

5. The semiconductor circuit according to claim 1, wherein:
   the load resistance section is connected to a power supply voltage terminal;
   the differential input section is connected to a ground terminal; and
   the load adjustment section is connected in parallel with the differential input section and the ground terminal.

6. The semiconductor circuit according to claim 1, wherein:
   the differential load resistance section is connected to a power supply voltage terminal;
   the differential input section is connected to a ground terminal; and
   the load adjustment section is connected in parallel with the load resistance section and a power supply voltage terminal.

7. The semiconductor circuit according to claim 1, wherein the load adjustment section is connected between the differential signal output terminals and a ground terminal.

8. The semiconductor circuit according to claim 1, wherein the load adjustment section is connected between the differential signal output terminals and a power supply voltage terminal.

9. A semiconductor circuit, comprising:
   a differential input section to receive input differential signals;
   a load resistance section to output a voltage according to a current output by the differential input section;
   differential signal output terminals to output a differential signal corresponding to the voltage output from the load resistance section;
   a low-pass filter to extract a direct-current component of the differential signal output from the differential signal output terminals; and
   a load adjustment section to feed back the direct-current component extracted by the low-pass filter to adjust a resistance value of the load resistance section,
   wherein the load resistance section includes:
      a fifth transistor having a drain connected to one of the differential signal output terminals, and a gate connected to another of the differential signal output terminals; and
      a sixth transistor having a drain connected to the another of the differential signal output terminals, and a gate connected to the one of the differential signal output terminals.

10. The semiconductor circuit according to claim 9, further comprising a plurality of stages of differential buffers connected between the differential signal output terminals and the low-pass filter.

11. The semiconductor circuit according to claim 9, wherein:
   the load adjustment section is connected to a ground terminal;
   the load resistance section is connected to a power supply voltage terminal; and
   the differential input section is connected between the load resistance section and the load adjustment section.

12. The semiconductor circuit according to claim 9, wherein:
   the load adjustment section is connected to a power supply voltage terminal;

the differential input section is connected to a ground terminal; and the load resistance section is connected between the load adjustment section and the differential input section.

13. The semiconductor circuit according to claim 9, wherein:

the load resistance section is connected to a power supply voltage terminal;

the differential input section is connected to a ground terminal; and the load adjustment section is connected in parallel with the differential input section and the ground terminal.

14. The semiconductor circuit according to claim 9, wherein:

the differential load resistance section is connected to a power supply voltage terminal;

the differential input section is connected to a ground terminal; and the load adjustment section is connected in parallel with the load resistance section and a power supply voltage terminal.

15. The semiconductor circuit according to claim 9, wherein the load adjustment section is connected between the differential signal output terminals and a ground terminal.

16. The semiconductor circuit according to claim 9, wherein the load adjustment section is connected between the differential signal output terminals and a power supply voltage terminal.

17. A semiconductor circuit, comprising:

a differential input section to receive input differential signals;

a load resistance section to output a voltage according to a current output by the differential input section;

differential signal output terminals to output a differential signal corresponding to the voltage output from the load resistance section;

a low-pass filter to extract a direct-current component of the differential signal output from the differential signal output terminals; and a load adjustment section to feed back the direct-current component extracted by the low-pass filter to adjust a resistance value of the load resistance section, wherein:

the load adjustment section is connected to a ground terminal;

the load resistance section is connected to a power supply voltage terminal; and the differential input section is connected between the load resistance section and the load adjustment section.

18. The semiconductor circuit according to claim 17, further comprising a plurality of stages of differential buffers connected between the differential signal output terminals and the low-pass filter.

19. A semiconductor circuit, comprising:

a differential input section to receive input differential signals;

a load resistance section to output a voltage according to a current output by the differential input section;

differential signal output terminals to output a differential signal corresponding to the voltage output from the load resistance section;

a low-pass filter to extract a direct-current component of the differential signal output from the differential signal output terminals; and a load adjustment section to feed back the direct-current component extracted by the low-pass filter to adjust a resistance value of the load resistance section, wherein:

the load adjustment section is connected to a power supply voltage terminal;

the differential input section is connected to a ground terminal; and the load resistance section is connected between the load adjustment section and the differential input section.

20. The semiconductor circuit according to claim 19, further comprising a plurality of stages of differential buffers connected between the differential signal output terminals and the low-pass filter.

21. A semiconductor circuit, comprising:

a differential input section to receive input differential signals;

a load resistance section to output a voltage according to a current output by the differential input section;

differential signal output terminals to output a differential signal corresponding to the voltage output from the load resistance section;

a low-pass filter to extract a direct-current component of the differential signal output from the differential signal output terminals; and a load adjustment section to feed back the direct-current component extracted by the low-pass filter to adjust a resistance value of the load resistance section, wherein:

the load resistance section is connected to a power supply voltage terminal;

the differential input section is connected to a ground terminal; and the load adjustment section is connected in parallel with the load resistance section and a power supply voltage terminal.

22. The semiconductor circuit according to claim 21, further comprising a plurality of stages of differential buffers connected between the differential signal output terminals and the low-pass filter.

23. A semiconductor circuit, comprising:

a differential input section to receive input differential signals;

a load resistance section to output a voltage according to a current output by the differential input section;

differential signal output terminals to output a differential signal corresponding to the voltage output from the load resistance section;

a low-pass filter to extract a direct-current component of the differential signal output from the differential signal output terminals; and a load adjustment section to feed back the direct-current component extracted by the low-pass filter to adjust a resistance value of the load resistance section, wherein the load adjustment section is connected between the differential signal output terminals and a power supply voltage terminal.

24. The semiconductor circuit according to claim 23, further comprising a plurality of stages of differential buffers connected between the differential signal output terminals and the low-pass filter.

25. A semiconductor circuit, comprising:

a differential input section to receive input differential signals;

a load resistance section to output a voltage according to a current output by the differential input section;

differential signal output terminals to output a differential signal corresponding to the voltage output from the load resistance section;

a low-pass filter to extract a direct-current component of the differential signal output from the differential signal output terminals; and a load adjustment section to feed back the direct-current component extracted by the low-pass filter to adjust a resistance value of the load resistance section, wherein the differential input section includes:
a first transistor having a gate receiving one of the input differential signals; and
a second transistor having a gate receiving another of the input differential signals, wherein the load resistance section includes:
the load adjustment section connected between a first node connected to a drain of the first transistor, and one of the differential signal output terminals, and between a second node connected to a drain of the second transistor, and another of the differential signal output terminals;
a fifth transistor having a gate connected to the second node, and a drain connected to the one of the differential signal output terminals; and
a sixth transistor having a gate connected to the first node, and a drain connected to the another of the differential signal output terminals.

26. The semiconductor circuit according to claim 25, wherein the differential input section is connected between the load resistance section and a ground terminal.

27. The semiconductor circuit according to claim 26, further comprising a plurality of stages of differential buffers connected between the differential signal output terminals and the low-pass filter.

28. The semiconductor circuit according to claim 25, further comprising a plurality of stages of differential buffers connected between the differential signal output terminals and the low-pass filter.

29. A semiconductor circuit, comprising:
a differential input section to receive input differential signals;
a load resistance section to output a voltage according to a current output by the differential input section;
differential signal output terminals to output a differential signal corresponding to the voltage output from the load resistance section;
a low-pass filter to extract a direct-current component of the differential signal output from the differential signal output terminals; and
a load adjustment section to feed back the direct-current component extracted by the low-pass filter to adjust a resistance value of the load resistance section,
wherein:
the low-pass filter includes a resistance section and a capacitance section;
the resistance section includes a first transfer gate and a second transfer gate, and the capacitance section includes a gate capacitance of a seventh transistor and a gate capacitance of an eighth transistor;
the first transfer gate has one terminal receiving one of the differential signals output from the differential signal output terminals, and has another terminal connected to a third node;
the second transfer gate has one terminal receiving another of the differential signals output from the differential signal output terminals, and has another terminal connected to a fourth node;
the seventh transistor has a drain and a source that are connected to the third node, and has a gate connected to the fourth node; and
the eighth transistor has a drain and a source that are connected to the fourth node, and has a gate connected to the third node.

30. A semiconductor circuit, comprising:
a differential input section to receive input differential signals;
a load resistance section to output a voltage according to a current output by the differential input section;
differential signal output terminals to output a differential signal corresponding to the voltage output from the load resistance section;
a low-pass filter to extract a direct-current component of the differential signal output from the differential signal output terminals; and
a load adjustment section to feed back the direct-current component extracted by the low-pass filter to adjust a resistance value of the load resistance section,
wherein:
the low-pass filter includes a resistance section and a capacitance section;
the resistance section includes a first transfer gate and a second transfer gate, and the capacitance section includes a gate capacitance of a seventh transistor and a gate capacitance of an eighth transistor;
the first transfer gate has one terminal receiving one of the differential signals output from the differential signal output terminals, and has another terminal connected to a third node;
the second transfer gate has one terminal receiving another of the differential signals output from the differential signal output terminals, and has another terminal connected to a fourth node;
the seventh transistor has a drain and a source that are connected to a ground terminal, and has a gate connected to the third node; and
the eighth transistor has a drain and a source that are connected to the ground terminal, and has a gate connected to the fourth node.

* * * * *